United States Patent
Rogers

[11] 3,932,817
[45] Jan. 13, 1976

[54] HIGH VOLTAGE TRIANGULAR WAVEFORM GENERATOR

[76] Inventor: Edwin J. Rogers, P. O. Box 3136, Austin, Tex. 78764

[22] Filed: Mar. 28, 1974

[21] Appl. No.: 455,644

[52] U.S. Cl. ............... 328/128; 328/181; 328/184; 315/389
[51] Int. Cl.² ...................... G06G 7/18; H03K 4/10
[58] Field of Search ............. 328/35, 128, 181–185; 315/387, 389, 404, 409, 410

[56] References Cited
UNITED STATES PATENTS

| | | | |
|---|---|---|---|
| 2,594,104 | 4/1952 | Washburn | 328/128 |
| 2,872,571 | 2/1959 | Lenz | 328/128 |
| 2,984,788 | 5/1961 | Korff et al. | 328/182 |
| 3,374,439 | 3/1968 | Hickey | 328/183 |

*Primary Examiner*—Stanley D. Miller, Jr.
*Attorney, Agent, or Firm*—Arnold, White & Durkee

[57] ABSTRACT

A high-voltage-level Miller circuit is employed, with capacitive coupling between the input current source and the amplifying device, and between the output terminal of the amplifying device and the deflection plate being driven. The coupling capacitors and integrating capacitor lie in a feedback loop, which greatly reduces output waveform distortion introduced by these capacitors, permitting the use of much smaller capacitor values. A small grid current provides a low-frequency amplitude constraint which stabilizes the operating point and prevents oscillations which would normally result from the oscillatory phase-shift characteristic produced by the use of the smaller capacitors.

10 Claims, 5 Drawing Figures

HIGH VOLTAGE TRIANGULAR WAVEFORM GENERATOR

FIELD OF THE INVENTION

This invention relates to electronic circuits, and particularly to a circuit which is especially adaptable for driving the deflection plates of devices such as particle accelerators, where a uniform scanning rate is desirable.

BACKGROUND OF THE INVENTION

It has been known in the past to use the Miller integrator principle to provide a triangular waveform to apply to the deflection plates of various scanning devices. The Miller integrator integrates a square-wave input to produce a triangular output waveform, usually at low voltage levels. Amplifiers were then provided to raise the output triangular waveform to the voltage levels necessary to sweep the scanning plates.

Linearity of the sweeping triangular waveform has long been an important design objective in such circuits. In the past, however, elimination of distortion from the output coupling network was previously achieved by the use of high capacitance, high-voltage output coupling capacitors, which are expensive and bulky, or by the use of special compensating networks that require adjustment for changing load conditions, a complication which is particularly undesirable in ion-implantation systems.

The employment of negative feedback to reduce distortion has, of course, been common practice for many years Its application, however, has been severely limited in systems which include more than two networks having a leading (or lagging) phase characteristic, because of the resulting strong tendency to oscillate. The design compromises required to attain dynamic stability in such systems frequently render their practical execution unfeasible.

BRIEF SUMMARY OF THE INVENTION

In the circuit of the present invention, the feedback capacitor is connected directly from the load to the current source, so as to include both the input and output coupling networks within the feedback loop, thereby eliminating the introduction of waveform distortion from these networks. The use of capacitive coupling from the current source to the input terminal of the amplifier allows the DC operating levels of the current source and the amplifier to be established independently. The current source may therefore be operated at any convenient voltage level upon which no critical stability requirement is imposed.

DETAILED DESCRIPTION

Figure 1:
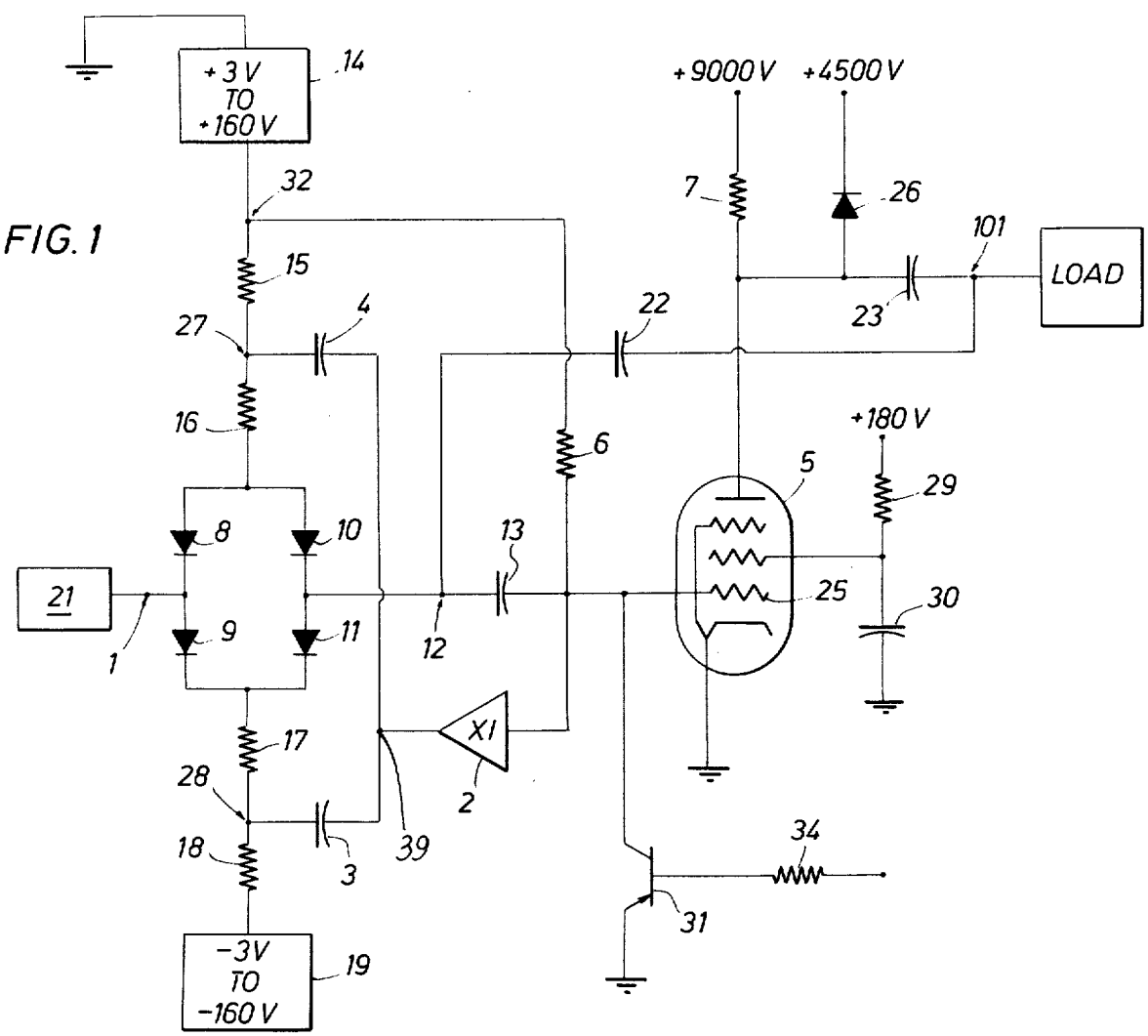
FIG. 1 is an illustration of the output circuit of the present invention.

Considering first FIG. 1 of the drawings, there is shown the output circuit of the present invention.

For best understanding of the operation of this circuit, first assume that the input terminal 1 is maintained at ground potential, and that amplifier 2 and capacitors 3 and 4 are not yet connected into the circuit; further assume that transistor 31 and resistor 34 are not yet connected into the circuit. The control grid 25 of a high-voltage pentode 5 is connected to a psoitive voltage source through resistor 6. Resistor 6 may be, for example, 80 megohms. Since no AC driving voltage is applied, the coupling capacitor 13, which may be, for example, 0.1 microfarads, effectively isolates the control grid 25 from the rest of the circuit.

A small positive grid current will flow through the resistor 6 to hold the tube in a state of plate voltage saturation. The plate potential will, therefore, stabilize at a low value, typically about 60 volts.

Consider now the condition of that part of the circuit shown to the left of coupling capacitor 13, with input terminal 1 still being held at ground potential. A current will flow from the positive charging supply 14, through resistors 15 and 16 (which may have values of 30 kilohms and 470 kilohms, respectively), through the steering diodes, 8, 9, 10 and 11, and resistors 17 and 18 (which may have values of 470 kilohms , and 30 kilohms, respectively). From here the current flows to the negative charging supply 19. In flowing through the steering diodes, the current divides equally between the parallel paths provided by diodes 8 and 9 and diodes 10 and 11. With reasonably well matched charging supply voltages, resistors and diodes, the voltage at point 12 will be substantially equal to 0, because of the symmetrical circuit configuration.

Figure 2:
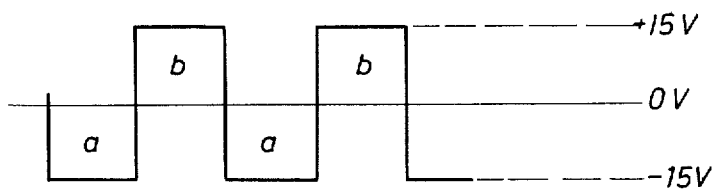
FIG. 2 is an illustration of the input waveform to the Miller circuit.

A symmetrical square-wave drive signal, illustrated in FIG. 2 of the drawings, may now be applied to point 1. For explanatory purposes, assume that the signal is applied exactly at the beginning of a negative alternation a, although it will be shown later that the driving signal may in fact be applied at any part of its cycle, or may be applied continuously. In the latter case, the sweep output is turned on and off by jeans to be later described.

As point 1 is driven negatively, diodes 9 and 10 are reverse biased and therefore cease conducting. The output current of the positive charging supply 14 now flows through diode 8 into the low impedance driving signal source 21, which serves at this time as a current sink. At the same time point 12 is connected to the negative charging supply 19, through diode 11 and resistors 17 and 18. The negative current flow to point 12 tends to cause point 12 to shift downward in potential.

The time constant of the coupling network comprised of capacitor 13 and resistor 6 is very long compared with the period of the sweep output. The potential shift at point 12 is, therefore, accurately reproduced at the control grid 25 of the pentode 5.

Figure 4:
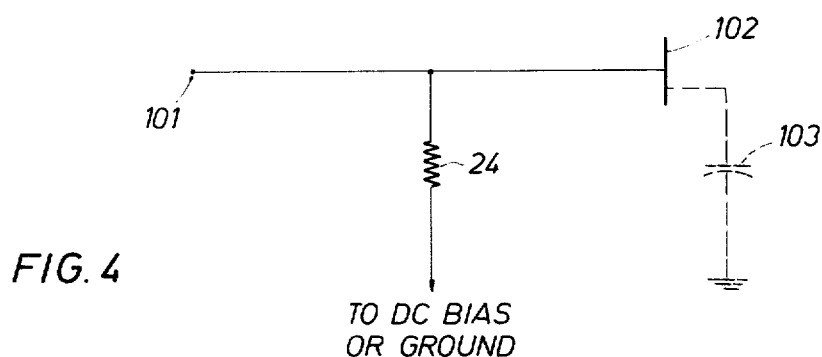
FIG. 4 is an illustration of the load circuit of the present invention.

The output coupling capacitor 23, which may be, for example, 0.001 microfarads, blocks the dc component of the plate voltage from the load. The capacitor 23 and the deflection plate resistor 24 (see FIG. 4) form a coupling network, again having a long time constant. The resistor 24 may have a value of 50 megohms. The ac component of the plate voltage, which is a highly amplified, inverted version of the grid signal, is thus applied to the load and the feedback capacitor 22, which may have a value of 10 picofarads. The other side of the feedback capacitor 22 is coupled to the control grid 25, through capacitor 13.

In accordance with the familiar Miller feedback principal, the pentode plate potential rises at a rate just sufficient to supply a charging current to the feedback capacitor 22, which is equal to the current flowing from point 12 to the negative charging supply 19. If the control grid excursion of the pentode is small compared with the charging supply voltage, the charging current may be regarded as being constant and proportional to the charging supply voltage. The output voltage therefore rises nearly linearly to maintain the required constant charging current for the duration of the negative driving signal alternation. The charging supply voltage is adjusted to produce a charging current of such magnitude that the plate voltage will reach the level required to yield the desired peak sweep voltage at the end of the charging period. The peak plate voltage is limited to one-half the supply voltage at maximum output, so that there will always be a large enough voltage drop across the plate load resistor 7, which may have a value of 1.5 megohms, to provide the required output current.

High-voltage clamping diode 26 is provided to protect the tube and capacitors against damage from excessive voltage, in the event of a circuit malfunction which might tend to drive the plate voltage to an abnormally high value.

When the drive signal voltage reverses, as shown in FIG. 2, alternation b, steering diodes 8 and 11 become reverse biased. The negative charging supply current now flows through resistors 18 and 17 and diode 9 to the drive signal generator 21, and point 12 is connected to the positive charging supply 14 through diode 10 and resistors 16 and 15. The plate voltage, now at its positive peak value, is driven downward as the feedback capacitor 22 is discharged by current from the positive charging supply 14. This process continues through the duration of alternation b, at the end of which the plate voltage will have returned to its saturation value and a complete cycle of operation will have been completed.

It should be noted that the operating point, i.e., the voltage about which the plate swings symmetrically to produce the desired peak-to-peak output, is such that the plate voltage just reaches the saturation value at its lowest point. This choice of operating point yields several important advantages. First, both the plate dissipation and peak plate voltage have the lowest possible values for any given sweep voltage requirement, allowing the most economical choice of tube. Second, the voltage drop across the plate load resistor 7 is maximized, thus providing the highest possible sweep current and voltage capability from a given value of plate supply voltage, again providing an economic advantage. Third, the tube is always operating at the highest possible plate current and the smallest fractional range of plate current variation for a given output requirement. In this condition its transconductance is highest, a condition most favorable for a highly linear output voltage waveform. In the forgoing explanation, the charging and discharging currents applied to point 12 were assumed to remain constant throughout the operating cycle. To produce the required grid voltage swing, however, the potential at point 12 must swing through a small range during each plate voltage excursion. The voltage drops across resistors 15 and 16 or 17 and 18, therefore, decrease slightly during the negative and positive output voltage excursions respectively. The resulting small variations in the charging and discharging currents, if not corrected, would introduce a linearity error in the output voltage. Assume now that the feedback amplifier 2 and capacitors 3 and 4 are connected into the circuit as shown in FIG. 1 of the drawings. The above-mentioned nonlinearity effect is reduced to negligible proportions by the application of positive feedback, which greatly increases the dynamic resistance of the current source, as in the following description.

A voltage follower 2, of extremely high input impedance and low output impedance, applies an accurate replica of the control grid voltage to point 39, which is capacitively coupled to points 27 and 28 via capacitors 4 and 3. These capacitors may be, for example, 20 microfarads each. A long time constant is again chosen so that the signals at points 27 and 28 faithfully represent the ac component of the grid voltage. The voltage drops across resistors 16 and 17, and therefore the charging and discharging currents, remain almost perfectly constant throughout the operating cycle. Since the maximum grid voltage swing is only a few volts and the output current required from the voltage follower 2 is small, a very inexpensive integrated circuit device provides an excellent follower.

As was stated earlier, the driving signal need not be applied to point 1 at any particular point in its cycle to insure proper operation. If, for example, the drive signal source is connected at an instant when alternation a has been partially completed, the plate potential will rise, but the charging period, having started late, will be shorter than normal and at its termination the plate voltage will not have had time to reach the correct peak value.

When alternation b commences, the plate potential will begin its downward excursion from a value which is too low. Under these conditions, the plate will "bottom" at its saturation voltage before the end of alternation b. At this point the plate can no longer provide a feedback signal to the grid through the feedback capacitor 22, and the grid quickly rises to a small positive potential at which point it becomes conductive, preventing any further rise. The grid end of capacitor 13 is effectively clamped to ground, and the current from the positive charging supply 14, which continues to flow for the remainder of alternation b, results in the accumulation of charge in capacitor 13.

When the next negative alternation of driving voltage commences, the charge in capacitor 13 causes point 12 to be at a higher potential than it was previously, thus increasing the voltage drop, and therefore the current, through resistor 17. The increased current causes the plate potential to increase at a faster rate and thus reach a higher peak potential than in the previous cycle.

The operation described above will be repeated in subsequent cycles until the accumulated charge in capacitor 13 reaches a value such that a plate potential just bottoms at its saturation value when the negative drive signal alternation arrives to start the upward plate excursion.

If the drive signal happens to be applied at an instant when it is in alternation b, the plate potential, which was already at its saturation value in the quiescent state, cannot move downward. As before, current from the positive charging supply will charge capacitor 13 for the remainder of alternations *b*, again adjusting the voltage across capacitor 13 toward the value required for proper operation. The optimum operating point for the tube is thus established automatically.

Because of the high charging rate of capacitor 13 through resistors 15 and 16 when the grid is in conduction, the process occurs quickly, never requiring more than two or three cycles of operation to reach completion.

The small current flowing through resistor 6 causes capacitor 13 to discharge slightly during each cycle of operation, resulting in a tendency for the operating point (average plate voltage) to drift slowly downward. In normal operation, no such drift can occur, because the self-regulating process just described causes the charge deficiency in capacitor 13 to be replenished by a very short pulse of grid current which flows at the end of each negative plate voltage excursion. Should the operating point be higher than the optimum value, resulting in failure of the plate voltage to reach its saturation value on the negative sweep voltage peaks, the downward drift of the operating point caused by the current injected by resistor 6 will take place until the optimum operating point is established. This action is required in the following situation:

The sweep voltage amplitude may be varied over a wide range (at least 15 to 1) by simultaneous adjustments of the positive and negative charging supply voltages. If these voltages are reduced while the circuit is in operation, the new value of sweep output voltage, being lower, calls for an operating point lower than that which has been established. Under these conditions the current flow in resistor 6 will cause the operating point to move downward until the plate voltage again bottoms to the saturation value on the negative output peaks.

Since the operating point is automatically established and maintained for any output amplitude up to the maximum, to critical accuracy or stability requirements are imposed upon any of the circuit components or voltage values.

Unbalance in the negative and positive charging supplies, which may be caused by drifts in component values or by tracking errors when their voltages are changed, results in a shift of the dc voltage level at point 12 so as to restore symmetry. This self-regulating process is effective as long as the imbalance is not so large as to require the dc voltage at point 12 to exceed the positive or negative limit of the driving signal voltage swing. At this point, the current-switching function of the diodes could no longer be accomplished. With the circuit parameters shown, matching errors approaching 10 percent in the charging supplies and their associated resistors could be tolerated before such malfunction would occur. This degree of matching is easily achieved using standard techniques and inexpensive components.

It was previously noted that, to replenish the charge bled from capacitor 13 through resistor 6, a short pulse of grid current flows at the end of each downward plate voltage excursion. The negative output voltage peaks are therefore slightly flattened, resulting in a loss in available sweep voltage. It is desirable that the current in resistor 6 be as small as possible to minimize this loss. The smaller this current is, however, the slower will be the rate at which the operating point will readjust following a reduction of the sweep output voltage.

At low sweep voltages a comparative slow rate of readjustment is tolerable, because the already low operating point does not have as far to go if the output is reduced to the minimum. A low value of injected current will thus suffice at low outputs.

Fortunately, at higher sweep voltages where a higher readjustment rate is desirable, the relative effect of a given amount of negative peak clipping is smaller, allowing the injection of a larger current through resistor 6. The optimum value of the injected current is therefore proportional to the output sweep voltage, which in turn is proportional to the charging supply voltages. Connecting the upper end of resistor 6 to the positive charging supply 14 rather than to a point of fixed potential causes the injected current to vary with the sweep amplitude in precisely desired manner. With this arrangement, circuit voltage equilibrium will be restored within two seconds following a 15:1 reduction in sweep amplitude. The negative peak clipping loss does not exceed one percent of the peak-to-peak value at any setting within this range.

In the foregoing description of operation, the sweep output voltage was turned on and off by connecting point 1 to the driving signal source or to ground, respectively. For practical reasons it is preferable to keep the driving signal source 21 in operation and connected to point 1 continuously, and to turn the sweep off by grounding the pentode control grid 25. This function is performed by the PNP transistor 31, which now may be assumed to be connected as shown.

Figure 3:
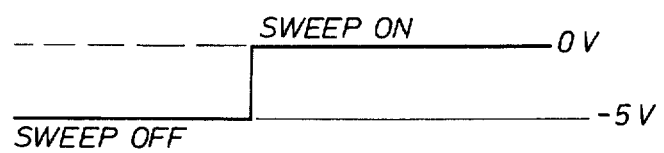
FIG. 3 is an illustration of the on-off switching waveform.

When negative base current is provided to the base of transistor 31 by the on-off control signal, shown in FIG. 3 of the drawings, the transistor effectively connects the pentode control grid 25 to ground, holding the tube in the desired state of plate voltage saturation. When the control signal transits to O volts, the transistor cuts off, releasing the control grid from its grounded condition. Operation then commences and the proper operating point for the tube is quickly established, as in the previous desciption. The signal is applied through resistor 34, which may have a value of 5.1 kilohms.

In the quiescent condition, the pentode is operating in a condition of plate voltage saturation. This condition is conducive to a heavy flow of screen current. The resulting large voltage drop across the screen supply resistor 29 (which may have a value of 36 kilohms) protects the screen from excessive power dissipation in the quiescent condition, by allowing the screen potential to fall to a low value.

The average plate current in the active state can never be as high as the quiescent value of plate current, because the average voltage across the load resistor, with an output signal present, can never be as great as it is when the plate potential is constantly at its lowest value. The plate current which flows during the downward plate voltage excursions, however, can approach twice the quiescent value, because the plate must conduct the discharge current from the load capacitance in addition to the current in the load resistor. The increased plate current in this part of the cycle demands that the tube have a higher screen grid voltage than that required merely to hold it in quiescent saturation.

In this circuit, the characteristics of the tube itself are used to adjust the screen voltage.

As soon as the tube is driven out of plate voltage saturation to produce a sweep output, a redistribution of space current in the tube takes place, causing a sharp reduction in screen current. The resulting smaller voltage drop in resistor 29 allows the screen voltage to rise to the required value. The value selected for screen by-pass capacitor 30, which may be, for example, 20 microfarads, is sufficiently large to hold the screen voltage essentially constant over the operating cycle, but not so large as to prevent the screen voltage from promptly adjusting its average value to changes in operating conditions.

Figure 5:
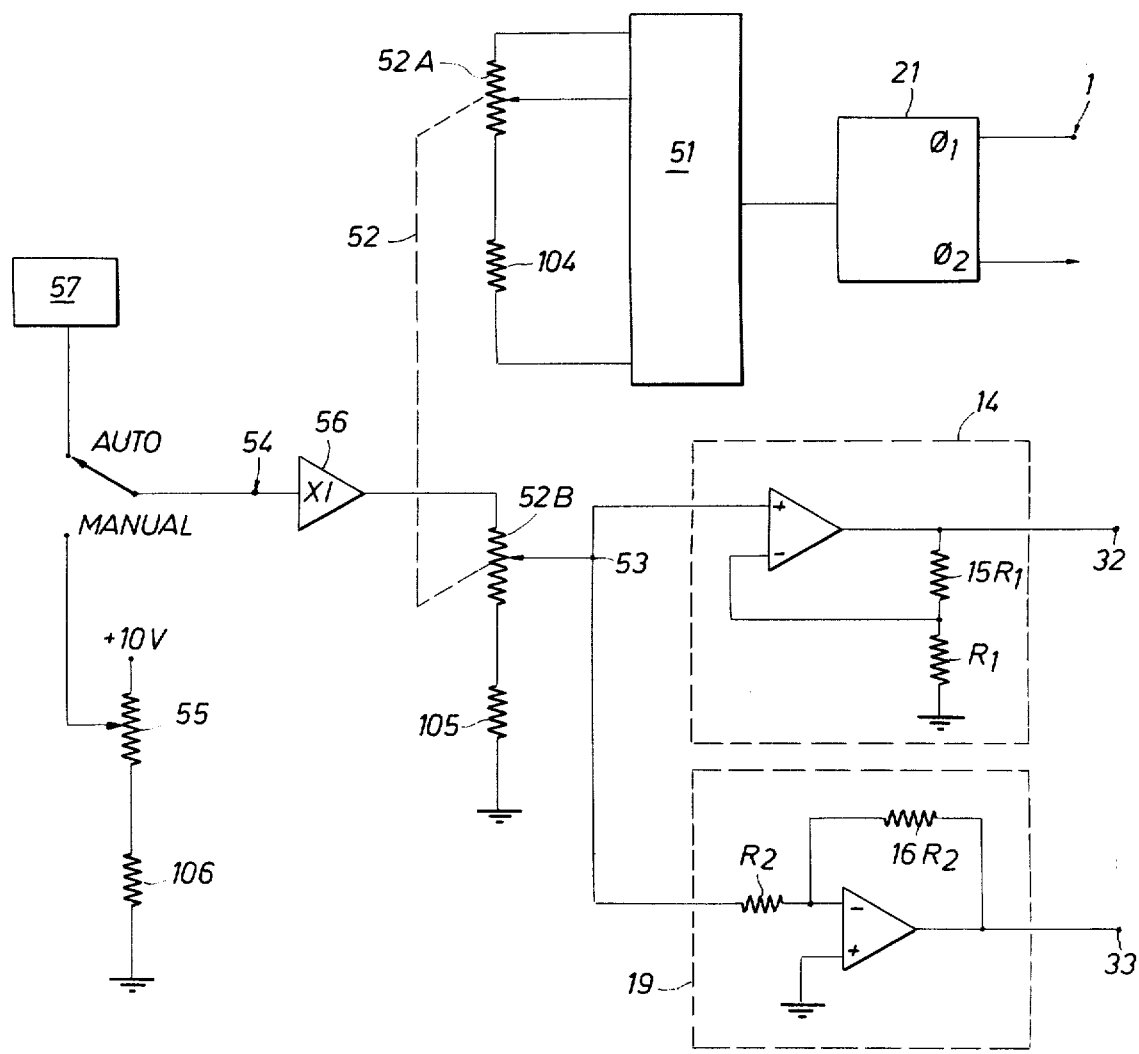
FIG. 5 is an illustration of the driving circuit of the present invention.

Referring now to FIG. 5 of the drawings, the driving circuit for the present invention is shown.

In this embodiment, the sweep generator has a frequency range of 1 kilohertz to 4 kilohertz and an amplitude range of 300 volts to 4 kilovolts. These ranges, selected for illustrative purposes, are not to be construed as limiting values. It is desirable for the frequency and amplitude to be separately and independently controllable. This result is accomplished in the following manner.

The frequency is established by a pulse generator 51, whose output frequency varies linearly with the rotational displacement of a potentiometer section A of the dual potentiometer 52. The output pulses trigger a toggling flip-flop circuit 21, which produces a two-phase, plus and minus 15 volt square wave output at one-half of the trigger frequency. The transistor flip-flop circuit employs clamped collector load resistors to enable it to perform either as a current source or sink. One output phase, $O_1$, of the flip-flop applies the required driving signal to point 1 of FIG. 1. The other phase, $O_2$, is connected to the corresponding point of another output circuit, not shown, which supplies the antiphase sweep voltage to the opposite deflection plate. It should be understood, therefore, that the circuit of FIG. 1 may actually be one-half of an output circuit, the other half being a mirror image connected to the other deflection plate.

As noted previously, the rate of change of the sweep voltage and therefore its amplitude, is proportional to the charging supply voltages. For the amplitude of the sweep output to remain constant over the frequency range, however, its rate of change must be proportional to the operating frequency as well as to the desired amplitude. The magnitudes of the charging supply voltages must therefore be proportional to the product of the desired sweep amplitude and the operating frequency.

The amplitude control signal 54, a dc voltage, variable from perhaps +0.75 to +10 volts, representing the desired sweep amplitude, is applied to the upper end of section B of the dual potentiometer 52. Since the fraction of this voltage selected by section B of the potentiometer 52 is proportional to the fractional setting of the frequency control potentiometer (section 52A) with which it shares a common shaft, the voltage at point 53 is proportional to the product of the amplitude control voltage and the frequency control setting.

The positive and negative charging supplies 14 and 19 are, respectively, noninverting and inverting dc amplifiers having identical absolute values of amplification. As shown in the example of FIG. 5, they may amplify the signal at point 53 (0.186 volts to 10 volts) by factors of +16 and −16, respectively. Their outputs, proportional to the voltage at point 53, provide the required complementary charging currents, which are fed to points 32 and 33 of the output circuit (FIG. 1).

The potentiometer resistors 52A and 52B may have values, for example, of 10 kolohms each, and the series resistors 104 and 105 may each have values of 3.3 kilohms.

In ion-implantation systems, the energy of the accelerated ions is variable, and in some cases must be changed substantially during operation. To maintain a constant scanning geometry, the sweep amplitude must vary in direct proportion to the beam energy. It is desirable for the sweep amplitude to track the energy automatically, so that manual adjustment is unnecessary. This result may be accomplished by applying the accelerator energy controlling signal 57, or an appropriate fraction thereof, to the sweep amplitude signal input 54. If manual control of the sweep amplitude is desired, it is obtained by deriving the amplitude control signal from the manually adjustable potentiometer 55, connected to a suitable voltage source. The potentiometer 55 may have, for example, a value of 50 kilohms, with the series resistor 106 having a value of 4 kilohms. The voltage follower 56, having a high input impedance and the unity gain, is included to prevent loading of the sweep amplitude control signal by potentiometer 52B.

The scanner described herein uses a feedback loop which includes three phase-advancing networks. Oscillation is prevented by a novel method which avoids the design compromises formerly associated with this practice.

The capacitors used for the input and output coupling, together with their associated resistive loads, can each produce a leading phase shift approaching 90° at low frequencies. A third leading phase characteristic is contributed by the feedback capacitor whose load consists of the dynamic resistance of the current source. Normally the inclusion in a feedback loop of three such phase-shifting elements will produce oscillations rendering it useless unless the values of their time constants are widely separated. The greater the amplification in the loop, the greater must be the time constant separation to achieve dynamic stability. The large value of loop gain needed for the highly linear output achieved here would normally require that the time constants of two of the phase-shifting elements be several thousand times greater than that of the third.

An additional requirement for high linearity is that the dynamic resistance of the input current source be very large, a condition satisfied here by the separate application of positive feedback.

The high impedance of the current source causes the time constant formed by it and the feedback capacitor to be at least several times greater than the sweep period at the lowest operating frequency. Once this time constant is established, the usual rules for the achievement of dynamic stability would dictate the use of input and output coupling networks having time constants thousands of times greater. The use of time constants of such magnitude would create unacceptably slow transient recovery characteristics and would require a high-voltage output coupling capacitor of such large capacitance as to be even more expensive and bulky than if it were not included in the feedback loop.

An unusual feature of the circuit of the present invention is that the three relevant time constants within the feedback loop are selected to yield a composite gain-phase characteristic which is not non-oscillatory, but rather has an oscillatory frequency which is approximately three orders of magnitude below the lowest operating frequency. Oscillation is then suppressed by the application of an amplitude constraint which is effective at the oscillatory frequency but not at the operating frequency.

The time constants referred to above are determined in the manner now to be described. The output coupling time constant is established by the selection of a high-voltage coupling capacitor of capacitance value just large enough to avoid excessive attenuation at the lowest operating frequency. Its size and cost are thus minimized.

The time constant produced by the feedback capacitor and the current source impedance is dictated by the output linearity, amplitude, and frequency requirements and is not subject to manipulation for other purposes.

The third and remaining relevant time constant is that of the network formed by the input coupling capacitor and grid resistor. A capacitance value is selected here to yield the desired low oscillatory frequency. Since this capacitor, unlike the output coupling capacitor, operates at low voltage, its selection to meet the above requirement incurs no significant penalty in cost or physical size.

The amplitude constraint which prevents oscillation occurs as a consequence of the method by which the operating point of the tube is established and maintained. The injection, through the grid resistor, of a small positive current, tends constantly to force the average plate voltage downward against a lower limit. This limit is imposed when the average plate voltage is such that the tube is driven momentarily into plate voltage saturation on the negative peaks of the output waveform. When this level is reached, a very short pulse of grid current flows at each negative output voltage peak. The grid current pulses deposit charge in the input coupling capacitor, so as to shift the bias point as required to check any further drop in the average plate voltage.

The time constant formed by the input coupling capacitor and a composite of the grid and current source resistors is very long compared to the sweep period. The regulatory mechanism described above thus responds so slowly as to have no effect upon the output waveform, except for a slight clipping of the negative peaks.

Recall now that the value of the input coupling capacitor has been selected to make the oscillatory frequency of the feedback loop thousands of times lower than the sweep frequency. At the resulting very low oscillatory frequency, which is the only frequency at which oscillations of the type under consideration could occur, the process which stabilizes the operating point is effective in spite of its comparatively slow response. Variations of the plate voltage at a rate commensurate with the oscillatory frequency are therefore strongly opposed and oscillations cannot occur.

The scanner as described employs both a positive and a negative charging current supply, each with a maximum output of 160 volts. A somewhat simpler configuration is possible, in which a positive supply of twice the output voltage is applied to the upper end of resistor 15 (FIG. 1), and the lower end of resistor 18 is connected to ground. The square wave applied to point 1 would then be applied to execute its plus and minus 15 volt excursions around a base line of one-half the charging supply voltage, rather than around zero volts as in FIG. 2.

Since the current source is capacitatively coupled to the amplifier, circuit operation is unaffected by changing the dc level at which the current source operates.

Two supplies were used in the disclosed embodiment, because at prevailing component prices a single supply of twice the output voltage might be more expensive than the two lower-voltage supplies.

I claim:

1. A triangular waveform generator circuit suitable for driving a deflection plate load, comprising:
   an amplifying device having an output electrode and a control electrode;
   a two-level current source;
   first capacitive coupling means connected between said current source and the control electrode of said amplifying device;
   second capacitive coupling means connected between the output electrode of said amplifying device and the load;
   an integrating capacitor connected between said current source and the load; and
   means connected to the control electrode of said amplifying device for automatically establishing and maintaining the operating point of said amplifying device.

2. The circuit of claim 1, further comprising positive feedback means connected between said amplifying device and said current source for raising the dynamic resistance of said current source.

3. The circuit of claim 1, wherein said amplifying device comprises a pentode.

4. The circuit of claim 2, wherein said amplifying device comprises a pentode.

5. The circuit of claim 3, further comprising a resistor, and a constant charging source, for supplying current to the screen grid of said pentode through said resistor.

6. The circuit of claim 4, further comprising a resistor, and a second constant-charging source, for supplying current to the screen grid of said pentode through said resistor.

7. The circuit of claim 1, wherein said integrating capacitor, said first capacitive coupling means, said second capacitive coupling means, and said amplifying device in combination form a feedback loop.

8. The circuit of claim 7, wherein said feedback loop yields a gain-phase characteristic that is oscillatory at a frequency below the lowest operating frequency of the circuit.

9. The circuit of claim 8, wherein said means for automatically establishing and maintaining the operating point of said amplifying device applies an amplitude constraint which is effective at the oscillatory frequency to suppress oscillation.

10. The circuit of claim 1, wherein said means for automatically establishing and maintaining the operation point of said amplifying device comprises a resistor connected between said current source and said amplifying device to provide a current pulse to the control electrode of said amplifying device.

* * * * *